United States Patent
Hosseini et al.

(10) Patent No.: US 7,728,415 B2
(45) Date of Patent: Jun. 1, 2010

(54) POWER SEMICONDUCTOR COMPONENT STACK USING LEAD TECHNOLOGY WITH SURFACE-MOUNTABLE EXTERNAL CONTACTS AND A METHOD FOR PRODUCING THE SAME

(75) Inventors: Khalil Hosseini, Weihmichl (DE); Alexander Koenigsberger, Regensburg (DE); Ralf Otremba, Kaufbeuren (DE); Joachim Mahler, Regensburg (DE); Xaver Schloegel, Sachsenkam (DE); Klaus Schiess, Allensbach (DE)

(73) Assignee: Infineon Technologies AG, Neubiberg (DE)

( * ) Notice: Subject to any disclaimer, the term of this patent is extended or adjusted under 35 U.S.C. 154(b) by 16 days.

(21) Appl. No.: 11/955,710

(22) Filed: Dec. 13, 2007

(65) Prior Publication Data

US 2008/0150105 A1    Jun. 26, 2008

Related U.S. Application Data

(63) Continuation of application No. PCT/DE2006/000726, filed on Apr. 26, 2006.

(30) Foreign Application Priority Data

Jun. 13, 2005    (DE)    ........................ 10 2005 027 356

(51) Int. Cl.
H01L 23/495    (2006.01)
H01L 27/088    (2006.01)
(52) U.S. Cl. .................. 257/676; 257/341; 257/401
(58) Field of Classification Search .......... 257/E23.079, 257/288, 401, 431, 29.027, 686, 691, 777, 257/207, 341, 676
See application file for complete search history.

(56) References Cited

U.S. PATENT DOCUMENTS

| | | | |
|---|---|---|---|
| 5,532,512 A * | 7/1996 | Fillion et al. | 257/686 |
| 6,040,626 A | 3/2000 | Cheah et al. | |
| 6,249,041 B1 | 6/2001 | Kasem et al. | |
| 6,319,755 B1 | 11/2001 | Mauri | |
| 6,593,622 B2 * | 7/2003 | Kinzer et al. | 257/341 |
| 6,992,386 B2 * | 1/2006 | Hata et al. | 257/735 |
| 7,042,086 B2 | 5/2006 | Shimoida et al. | |
| 7,633,141 B2 * | 12/2009 | Huber | 257/666 |
| 2004/0063240 A1 | 4/2004 | Madrid et al. | |
| 2004/0169289 A1 | 9/2004 | Satou et al. | |
| 2005/0023658 A1 | 2/2005 | Tabira et al. | |
| 2005/0023670 A1 | 2/2005 | Hata et al. | |
| 2005/0275082 A1 * | 12/2005 | Ferrara et al. | 257/691 |

(Continued)

FOREIGN PATENT DOCUMENTS

DE    10134943 A1    10/2002

*Primary Examiner*—Leonardo Andújar
*Assistant Examiner*—Teresa M Arroyo
(74) *Attorney, Agent, or Firm*—Edell, Shapiro, Finnan, LLC

(57) ABSTRACT

A power semiconductor component stack, using lead technology with surface-mountable external contacts, includes at least two MOSFET power semiconductor components each having a top side and an underside. The underside includes: a drain external contact area, a source external contact area and a gate external contact area. The top side includes at least one source external contact area and a gate external contact area. The gate external contact areas on the top side and the underside are electrically connected to one another. The power semiconductor component stack is a series circuit or a parallel circuit of MOSFET power semiconductor components arranged one above another in a plastic housing composition.

14 Claims, 8 Drawing Sheets

U.S. PATENT DOCUMENTS

2006/0237814 A1    10/2006   Hosseini et al.
2007/0200250 A1     8/2007   Koenigsberger et al.
2007/0266558 A1*   11/2007   Otremba .................... 29/840
2008/0224300 A1*    9/2008   Otremba .................... 257/693
2009/0039484 A1*    2/2009   Mahler et al. ............... 257/676
2009/0189259 A1*    7/2009   Mohamed et al. ........... 257/666

* cited by examiner

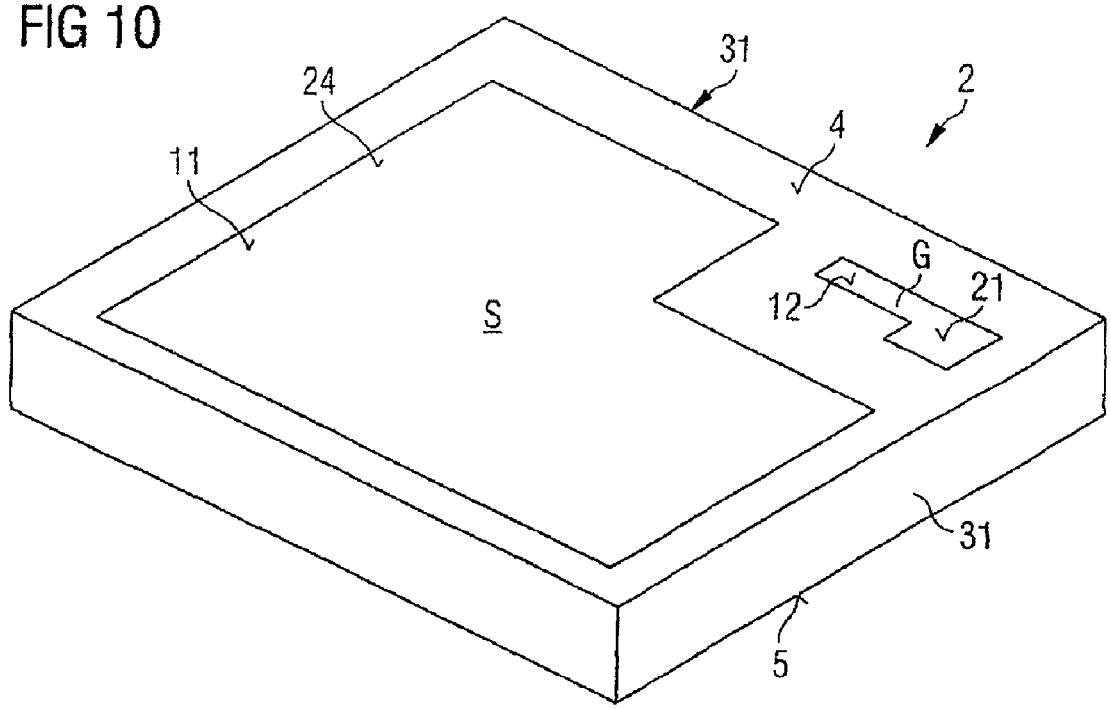
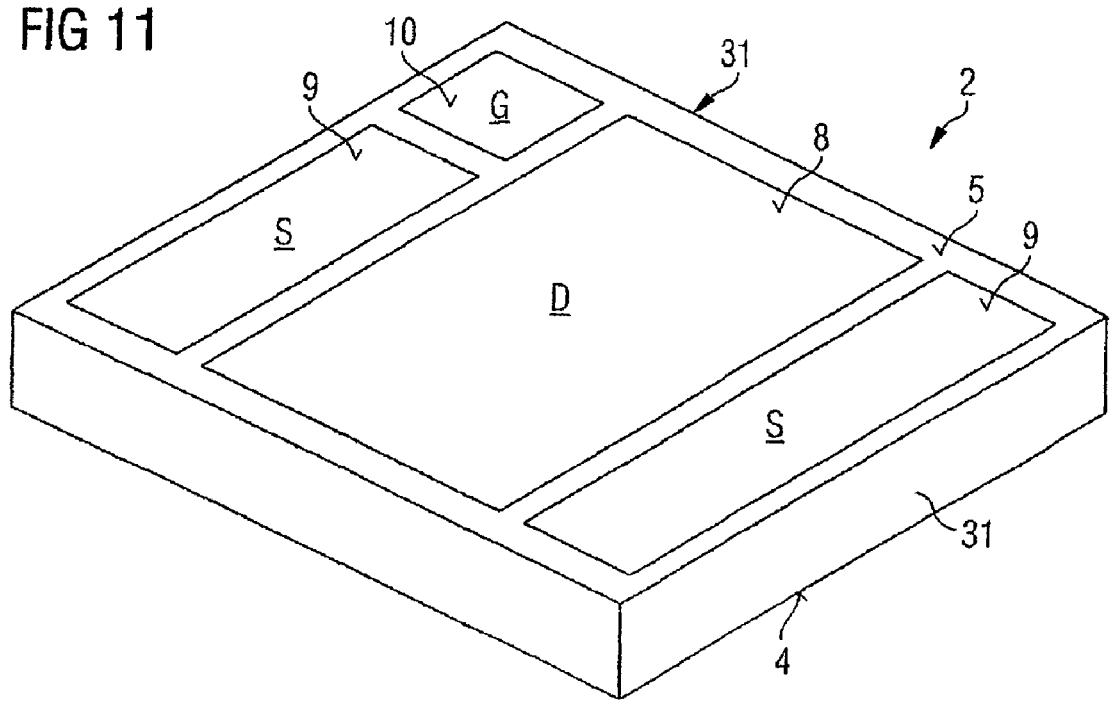

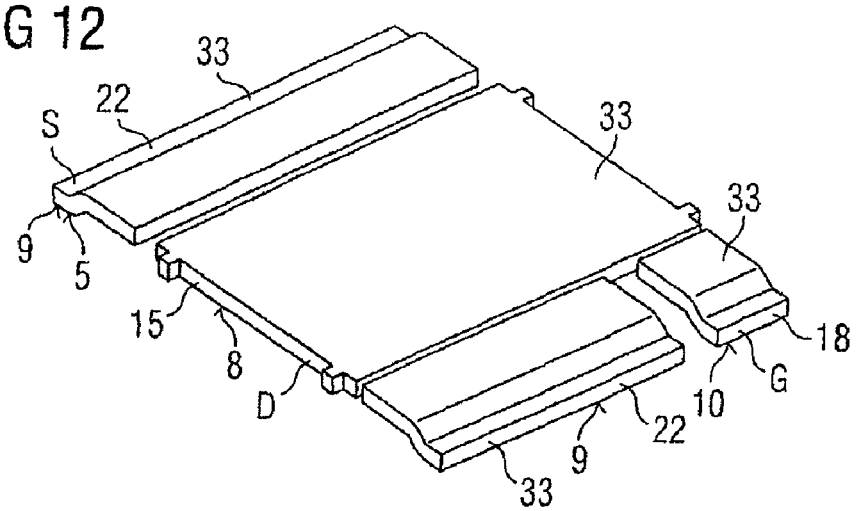
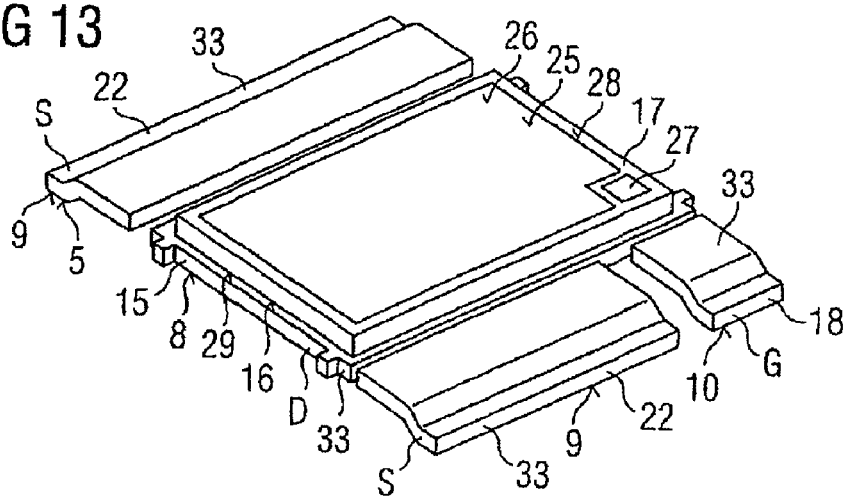
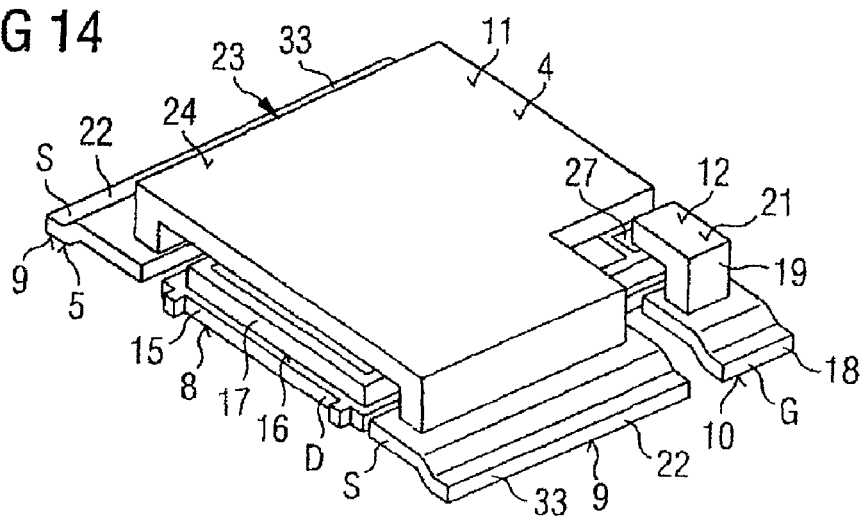

POWER SEMICONDUCTOR COMPONENT STACK USING LEAD TECHNOLOGY WITH SURFACE-MOUNTABLE EXTERNAL CONTACTS AND A METHOD FOR PRODUCING THE SAME

CROSS REFERENCE TO RELATED APPLICATIONS

This application is a continuation of International Application No. PCT/DE2006/000726, filed on Apr. 26, 2006, entitled "Power Semiconductor Component Stack Using Lead Technology with Surface-Mountable External Contacts and a Method for Production Thereof," which claims priority under 35 U.S.C. §119 to Application No. DE 102005027356.4 filed on Jun. 13, 2005, entitled "Power Semiconductor Component Stack Using Lead Technology with Surface-Mountable External Contacts and a Method for Production Thereof," the entire contents of which are hereby incorporated by reference.

BACKGROUND

Known surface-mountable power components have a large-area drain contact and two large-area source contacts and also a small-area gate contact on their underside and a large-area source contact on the top side.

These known surface-mountable power semiconductor components are nevertheless not stackable since the geometry of the surface contacts for source, drain and gate is not coordinated with one another nor is there a stackable gate contact present on the top side. Consequently, power semiconductor components of this type, for increasing the reverse voltage, have to be mounted alongside one another in series on a superordinate circuit board, which necessitates a considerable area requirement on the circuit board. Even a parallel circuit of MOSFET power semiconductor components of this type on a superordinate circuit board likewise necessitates arranging MOSFET power semiconductor components of this type alongside one another, which components can then be connected in parallel via their surface-mountable external contacts with the aid of the surface-populatable circuit board.

SUMMARY

Described herein is a power semiconductor component stack using lead technology with surface-mountable external contacts and a method for producing the same. The power semiconductor component stack comprises at least two MOSFET power semiconductor components, each having a top side and an underside. In this case, the underside comprises a drain external contact area, a source external contact area and a gate external contact area. The top side comprises at least one source external contact area and a gate external contact area. The gate external contact areas on the top side and the underside are electrically connected to one another. The power semiconductor component stack comprises a series circuit or a parallel circuit of MOSFET power semiconductor components arranged one above another in a plastic housing composition.

BRIEF DESCRIPTION OF THE DRAWINGS

The device and method will now be explained in more detail with reference to the accompanying figures, where:

FIGS. 5 to 11 show schematic, perspective views of component parts of a MOSFET power semiconductor component of a first embodiment for a power semiconductor component stack, in accordance with FIG. 2 or FIG. 4;

FIG. 5 shows a schematic, perspective structure of lead external contacts of the MOSFET power semiconductor component of a lead mounting strip;

FIG. 6 shows a schematic, perspective view of the structure in accordance with FIG. 5, after the application of a power semiconductor component chip;

FIG. 7 shows a schematic, perspective view of the structure in accordance with FIG. 6, after the application of a source through contact element;

FIG. 8 shows a schematic, perspective view of the structure in accordance with FIG. 7, after the application of a gate through contact element;

FIG. 9 shows a schematic, perspective view after embedding the structure, in accordance with FIG. 8, into a plastic housing composition;

FIG. 10 shows a schematic, perspective view of the top side of the completed MOSFET power semiconductor component for a power semiconductor component stack;

FIG. 11 shows a schematic, perspective view of the underside of the completed MOSFET power semiconductor component for a power semiconductor component stack;

FIGS. 12 to 16 show schematic, perspective views of component parts of a MOSFET power semiconductor component, of a second embodiment, for a power semiconductor component stack in accordance with FIG. 2 or FIG. 4;

FIG. 12 shows a schematic, perspective view of a structure of external contacts of the MOSFET power semiconductor component of a lead mounting strip;

FIG. 13 shows a schematic, perspective view of a structure in accordance with FIG. 12 with an applied power semiconductor chip;

FIG. 14 shows a schematic, perspective view of the structure in accordance with FIG. 13, with an applied source through contact element and a gate through contact element;

FIG. 15 shows a schematic, perspective view of the top side of the completed MOSFET power semiconductor component for a power semiconductor component stack; and FIG. 16 shows a schematic, perspective view of the underside of the completed MOSFET power semiconductor component for a power semiconductor component stack.

DETAILED DESCRIPTION

Figure 1:
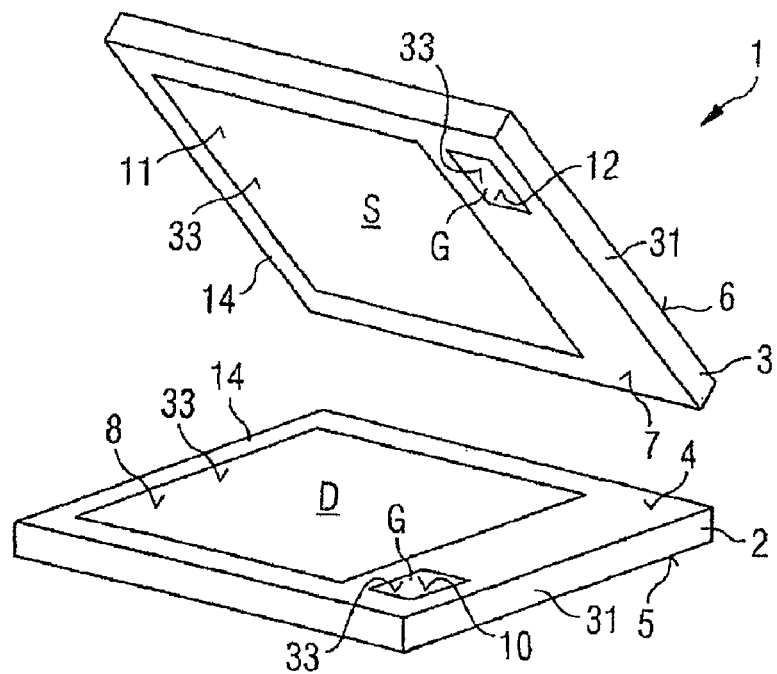
FIG. 1 shows a schematic, opened-up, perspective view of two MOSFET power semiconductor components for a series-connected MOSFET power semiconductor component stack.

Described herein is a power semiconductor component stack using lead technology with surface-mountable external contacts and a method for producing the same. The power semiconductor component stack allows for a reduced area requirement of series circuits and parallel circuits of MOSFET power semiconductor components with surface-mountable external contacts, thereby allowing a higher packing density on the superordinate circuit boards.

The power semiconductor component stack, using lead technology with surface-mountable external contact areas, comprises at least two MOSFET power semiconductor components each having a top side and an underside. For this purpose, the underside comprises a drain external contact area, a source external contact area and a gate external contact area.

The top sides of the stacked MOSFET power semiconductor components include at least one source external contact area and a gate external contact area, wherein the gate external contact areas on the top side and on the underside are electrically connected to one another. The source external contact areas on the top side and on the underside are also electrically connected to one another. MOSFET power semiconductor components of this type are arranged one above another in a series circuit or in a parallel circuit to form a power semiconductor component stack, such that it is possible to achieve a higher circuit density for a superordinate circuit substrate.

A power semiconductor component stack of this type has not only the advantage of a smaller area requirement, but also the advantage of a higher reliability of the series and parallel circuits constructed in this form, especially as no connecting lines have to be laid along a circuit board between the MOSFET power semiconductor components. This also simplifies the design of the superordinate circuit board, such that a compression of the power density can be achieved.

By utilizing the electrical gate contact locations at the top side and on the underside of the housing, it is possible to increase the three-dimensional mounting for series and parallel circuits of housings stacked one on top of another. This makes it possible to increase an integration density with the basic plan remaining the same, that is to say that a more complex semiconductor component construction with power semiconductor components arranged alongside one another on a superordinate circuit board is no longer necessary. At the same time, improved electrical properties are achieved, especially as the connecting lines for series and parallel circuits on a superordinate circuit board are obviated.

With a stacked series circuit it is possible to achieve the increase in the electrical blocking capability, wherein here the source external contact of one MOSFET power semiconductor component is connected to the drain external contact of the other MOSFET power semiconductor component. For this purpose, the components can be soldered onto one another, or be clamped onto one another. A parallel circuit serves for reducing the electrical losses, wherein here either the two source or else the two drain external contacts of the stacked MOSFET power semiconductor components are connected to one another. While as many MOSFET power semiconductor components as desired with surface-mountable external contacts on their top sides and undersides can be stacked one on top of another in the case of the series circuit, it is necessary to insert intermediate contacts in intermediate planes in the case of a parallel circuit of two or more MOSFET power semiconductor components on a stack.

In the case of a series circuit of MOSFET power semiconductor components arranged one above another, the components have at least one drain external contact area and a gate external contact area on their underside and at least one source external contact area and a gate external contact area on their top side. On the intermediate plane of the power semiconductor component stack, the source external contact area of the lower MOSFET power semiconductor component is surface-mounted with the drain external contact area of the upper MOSFET power semiconductor component and the gate external contact areas of the two stacked MOSFETs are electrically connected to one another. In this case, the source external contact area on the underside of the upper MOSFET power semiconductor component, which is not required for the series circuit, can be protected by an insulation film. This power semiconductor component stack advantageously practically doubles the blocking capability between the lower source electrode of the bottommost MOSFET power semiconductor component and the drain electrode of the topmost MOSFET power semiconductor component.

However, as long as only two electrode areas can be stacked one on top of the other in the intermediate plane and not all three electrodes of a MOSFET power semiconductor transistor are available in the intermediate plane, then it is still necessary to lead back either the source electrode and/or the drain electrode from the top side onto the plane of the superordinate circuit board, which can be effected by means of a corresponding conduction strip. With the aid of such a conduction strip, the topmost electrode, which is not available in the intermediate plane, is electrically connected via the conduction strip to a corresponding contact pad of the superordinate circuit board.

In a further embodiment, it is provided that in the case of a parallel circuit of MOSFET power semiconductor components arranged one above another, the underside and the top side either both have a drain external contact area or both have a source external contact area and in each case a gate external contact area. In this case, on the intermediate plane of the power semiconductor component stack, two source external contact areas or two drain external contact areas and also two gate external contact areas of the lower and of the upper MOSFET power semiconductor component are electrically connected to one another. This power semiconductor component stack also needs a conduction strip on the top side of the power semiconductor component stack if only two of the three surface-mountable electrodes of a MOSFET power transistor are provided on the intermediate plane.

In a further embodiment, a lead chip island comprises the drain external contact area, on which a rear side chip contact of a power semiconductor component chip is arranged and is cohesively connected to the lead chip island. This construction has the advantage that the lead chip island practically simultaneously represents the surface-mountable drain external contact.

Furthermore, a lead gate electrode includes the gate external contact area on the underside, wherein a gate through contact element is arranged cohesively on the lead gate electrode, wherein the gate through contact element comprises on its top side the gate external contact area of the top side of a MOSFET power semiconductor component. Therefore, via this gate through contact element, a gate external contact area is available in each case both on the underside of the MOSFET power semiconductor component and on the top side of the MOSFET power semiconductor component.

Moreover, a lead source electrode comprises the source external contact area on the underside, wherein a source through contact element is arranged cohesively on the lead source electrode, the source through contact element comprising on its top side the source external contact area of the top side of the MOSFET power semiconductor component. This advantageously ensures that a source external contact area is in each case available both on the underside of the MOSFET power semiconductor component and on the top side of the MOSFET power semiconductor component. The source through contact element is formed correspondingly.

The MOSFET power semiconductor component of one embodiment includes a conductive adhesive connection as a cohesive connection. Furthermore, the MOSFET power semiconductor component can include a eutectic soldering connection as a cohesive connection. Finally, it is also possible to use a diffusion soldering connection as a cohesive connection and there is moreover the possibility of using a conductive adhesive film as a cohesive connection. Furthermore, it is also possible to use solder paste connections for the cohesive connection within the MOSFET power semiconductor component. Accordingly, the cohesive connection is an option for fixing, for example, the gate through element on the lead gate electrode.

The above cohesive connection possibilities are also available for fixing, for example, the power semiconductor chip by its drain electrode on the lead chip island and, finally, the source through contact element can advantageously be cohesively fixed on the source electrode of the power semiconductor chip via the abovementioned possibilities.

In a further embodiment, the power semiconductor chip is arranged in the MOSFET power semiconductor component in such a way that the rear side chip electrode is freely accessible via the lead chip island. By virtue of this free accessibility, the lead chip island practically forms the drain external contact area of the MOSFET power semiconductor component. Furthermore, the rear side chip electrode of the power semiconductor chip can include a metal block, the areal extent of which is adapted to the rear side chip electrode and which serves as heat sink. In this case, an area of the metal block is externally accessible, and forms the drain external contact area of the MOSFET power semiconductor component that is situated on the underside. The metal block, simultaneously serving as heat sink, furthermore ensures that the power loss is dissipated securely and reliably from the housing of the power semiconductor component stack.

A method for producing a plurality of MOSFET power semiconductor components using lead technology with a power semiconductor chip and subsequent stacking to form power semiconductor component stacks connected in series or in parallel comprises the following method steps.

The first step involves producing individual power semiconductor chips with a common large-area source electrode and a common gate electrode of MOSFET structures on the top side of the power semiconductor chip and with a large-area rear side electrode as drain electrode of the power semiconductor chip, wherein the areal extent of the drain electrode corresponds to the size of the rear side of the power semiconductor chip. Furthermore, provision is made of a leadframe with a lead chip island, at least one lead source electrode and at least one lead gate electrode in a plurality of power semiconductor component positions. Thereafter, the drain electrodes of the power semiconductor chips are cohesively connected to lead chip islands of the leadframe. This is followed by a cohesive connection of a gate through contact element, comprising a gate external contact area for the top side of the MOSFET power semiconductor component, cohesively and electrically conductively connected to the lead gate electrode of the leadframe and the gate electrode on the top side of the power semiconductor component chip.

After mounting of the gate through contact element, a gate external contact area is then available both on the underside and on the top side of the future power semiconductor component in each of the power semiconductor component positions of the leadframe. Subsequently or previously, a source through contact element, comprising the source external contact area of the top side of the respective MOSFET power semiconductor component, is cohesively connected to the lead source electrode of the leadframe and the source electrode of the power semiconductor chip. Thus, a source contact area is also available both on the underside of the future MOSFET power semiconductor component and on the top side of the future MOSFET power semiconductor component. Thereafter, the previously assembled component parts of the MOSFET power semiconductor components of the leadframe are packaged into a plastic housing composition, while leaving free the source and gate external contact areas on the top side and the drain, source and gate external contact areas on the underside of the MOSFET power semiconductor component in the power semiconductor component positions of the leadframe. Subsequently, in each case at least two of the MOSFET power semiconductor components can be stacked one on top of another to form series- or parallel-connected power semiconductor component stacks with cohesive surface mounting of the corresponding external contact areas of the MOSFET power semiconductor components.

This method has the advantage that proceeding from the production of a plurality of MOSFET power semiconductor components on a common leadframe, after the separation of the leadframe into individual MOSFET power semiconductor components, the method now affords the possibility of stacking such MOSFET power semiconductor components one on top of another both in series and in parallel, in order thereby to achieve a higher power density and a smaller area requirement. For the cohesive connection of the external contact areas of the MOSFET power semiconductor components one above another, it is possible to use an adhesive bonding method with a conductive adhesive, or to use a diffusion soldering method. Furthermore, it is possible to use eutectic solders, or else to carry out solder connections with the aid of metal pastes. An injection-molding method is optionally used for the packaging of the MOSFET power semiconductor component into a plastic housing composition.

In the following paragraphs, embodiments of the device and method are described in connection with the figures.

Figure 2:
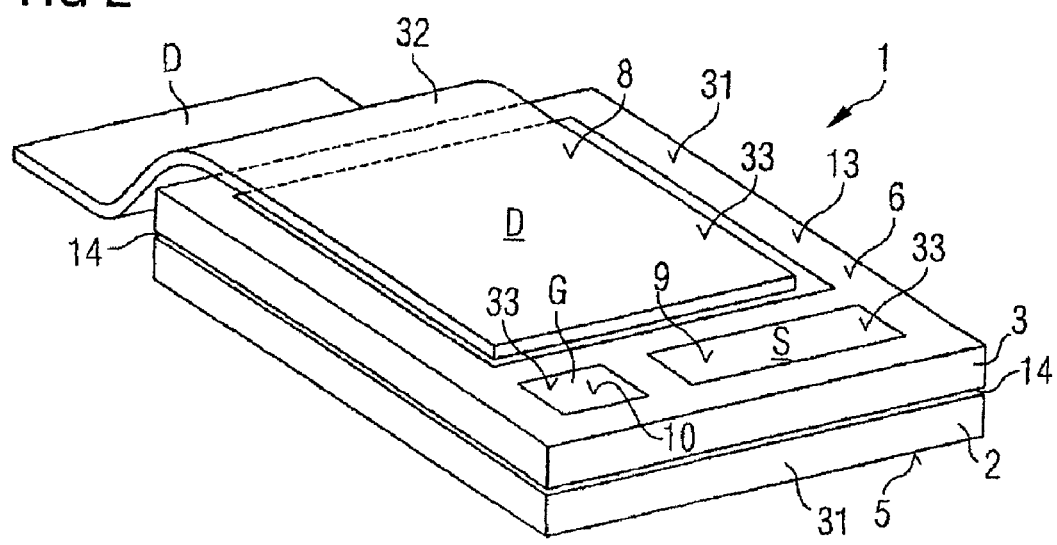
FIG. 2 shows a schematic, perspective view of a series-connected MOSFET power semiconductor component stack.

FIG. 1 shows a schematic, opened-up, perspective view of two MOSFET power semiconductor components 2 and 3, for a series-connected MOSFET power semiconductor component stack 1, which is shown in FIG. 2. This opened-up, perspective view reveals the intermediate plane 14 between the lower MOSFET power semiconductor component 2 and the upper MOSFET power semiconductor component 3 with its top side 6 and its underside 7. In order to form a MOSFET power semiconductor component stack, a drain external contact area 8 on the top side 4 of the lower MOSFET power semiconductor component 2 together with a source external contact area 11 of the upper MOSFET power semiconductor component 3, which are visible here in the opened-up state, are soldered onto one another, wherein the gate external contact areas 10, 12 of the lower MOSFET power semiconductor component 2 and of the upper MOSFET power semiconductor component 3 that are visible here are simultaneously soldered congruently onto one another to form a series-connected MOSFET power semiconductor component stack 1, as shown by FIG. 2.

FIG. 2 shows a schematic, perspective view of a series-connected MOSFET power semiconductor component stack 1, wherein a large-area drain contact D is arranged on the top side 13 of the power semiconductor component stack 1, and is led to the level of the underside 5 of the lower MOSFET power semiconductor component 2 via a conduction strip 32. The conduction strip 32 is necessary only when no drain through contact element can be led internally via the intermediate plane 14 shown in FIG. 1. The gate external contact G shown on the top side 13 of the series-connected power semiconductor component stack 1 is also present in the intermediate plane 14 via a corresponding gate through contact element and is arranged on the underside 5 of the lower MOSFET power semiconductor component 2 via the intermediate plane 14. The same applies to the source external contact S arranged on the top side 13 of the power semiconductor component stack 1, the source external contact likewise being available via a source through contact element on a lead source electrode and finally on the underside 5 of the lower MOSFET power semiconductor component 2.

Figure 3:
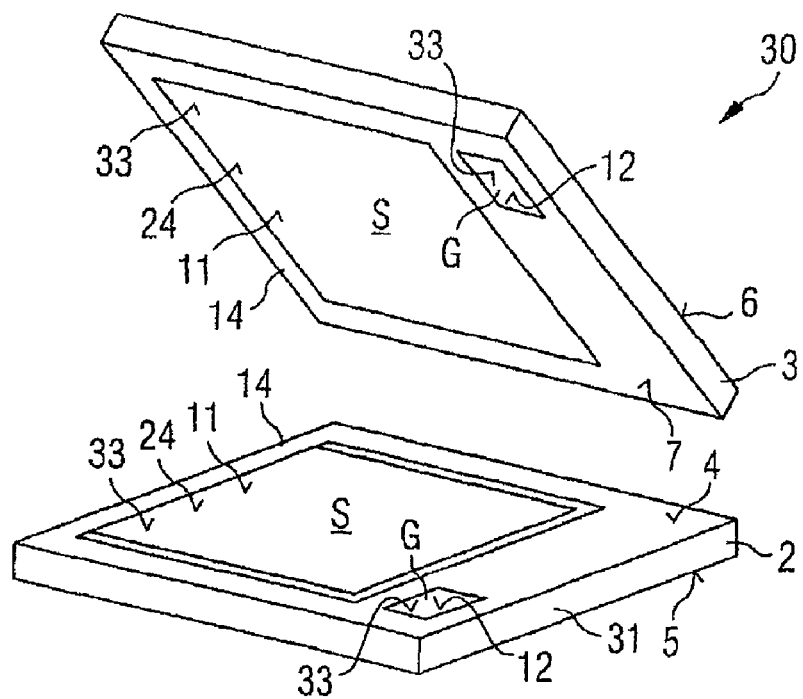
FIG. 3 shows a schematic, opened-up, perspective view of two MOSFET power semiconductor components for a parallel-connected MOSFET power semiconductor component stack.
Figure 4:
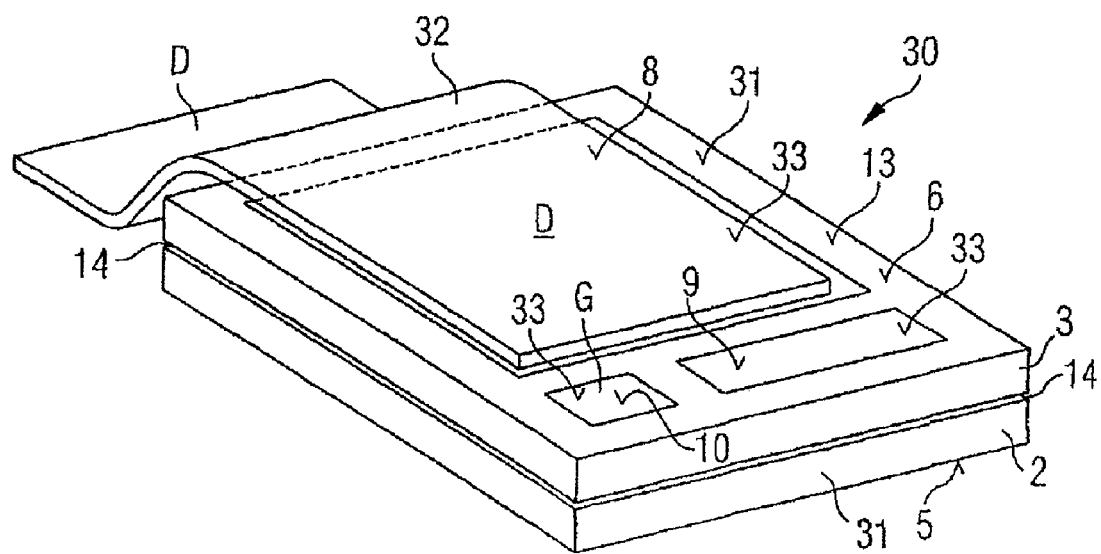
FIG. 4 shows a schematic, perspective view of a parallel-connected MOSFET power semiconductor component stack.

FIG. 3 shows a schematic, opened-up, perspective view of two MOSFET power semiconductor components 2 and 3 for a parallel-connected MOSFET power semiconductor component stack 30, which is shown in FIG. 4. In this case, in the intermediate plane 14 for a parallel-connected MOSFET power semiconductor component stack, two source electrodes S are arranged congruently one above another, and two gate external contacts G are likewise aligned congruently with respect to one another. For a parallel circuit, the two source and the two gate external contacts in the intermediate plane 14 are aligned with one another and electrically connected to one another via a soldering layer. This then results in the MOSFET power semiconductor component stack 30 shown in FIG. 4.

FIG. 4 shows a schematic, perspective view of a parallel-connected MOSFET power semiconductor component stack 30, which has a drain external contact D, a source external contact S and a gate external contact G on its top side. In this case, the gate external contact G and the source external contact S are looped through via the intermediate plane 14 down to the underside 5 of the MOSFET power semiconductor component stack 30, while a conduction strip 32 is provided for the drain external contact D on the top side 13 of the MOSFET power semiconductor component stack 30 in order to lead the drain external contact D from the top side 13 of the MOSFET power semiconductor component stack 30 to the level of the underside 5 of the MOSFET power semiconductor component stack 30. If corresponding drain external contacts are also provided in addition to the source external contacts S and the gate external contacts G in the intermediate plane 14 as shown in FIG. 3, then the conduction strip 32 can be dispensed with in the case of a series circuit.

FIGS. 5 to 11 show schematic, perspective views of component parts of a MOSFET power semiconductor component 2, of a first embodiment, for a power semiconductor component stack 1 or 30, in accordance with FIG. 2 or FIG. 4. Component parts having the same functions as in the previous figures are identified by the same reference symbols and are not discussed separately in FIGS. 5 to 11.

Figure 5:
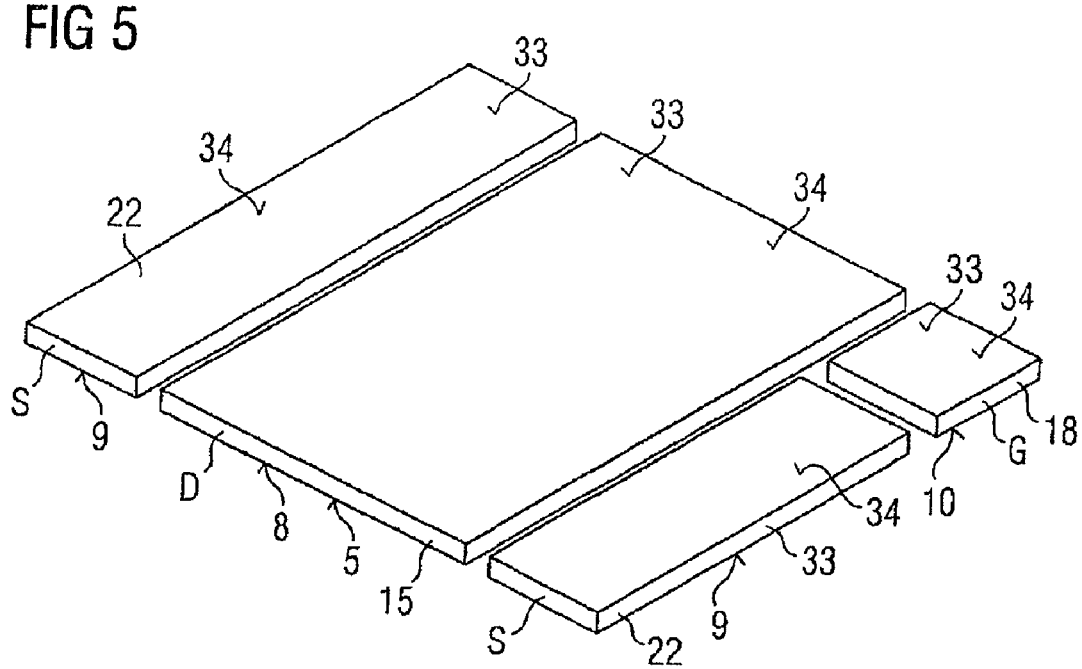

FIG. 5 shows schematic, perspective views of structures of lead external contacts 33 of a MOSFET power semiconductor component of a lead mounting strip with a plurality of power semiconductor component positions. Such a mounting strip comprises a plurality of such structures of external contacts 33 which are arranged in rows and columns on the mounting strip for a plurality of power semiconductor components. In this embodiment, the external contacts 33 are arranged in such a way that a large-area lead chip island 15 is arranged in the center, the chip island includes a drain external contact area 8 on its underside 5 and can receive the rear side chip contact of a power semiconductor chip on its top side. Two external contacts 33 are arranged on two opposite sides, and include a source external contact area 9 on their underside. Finally, an external contact 33 with a gate external contact area 10 on its underside 5 is provided in a corner of the structure. This structure of external contacts 33 forms an inner housing plane 34 with their top sides and is arranged on the housing underside with their undersides 5.

Figure 6:
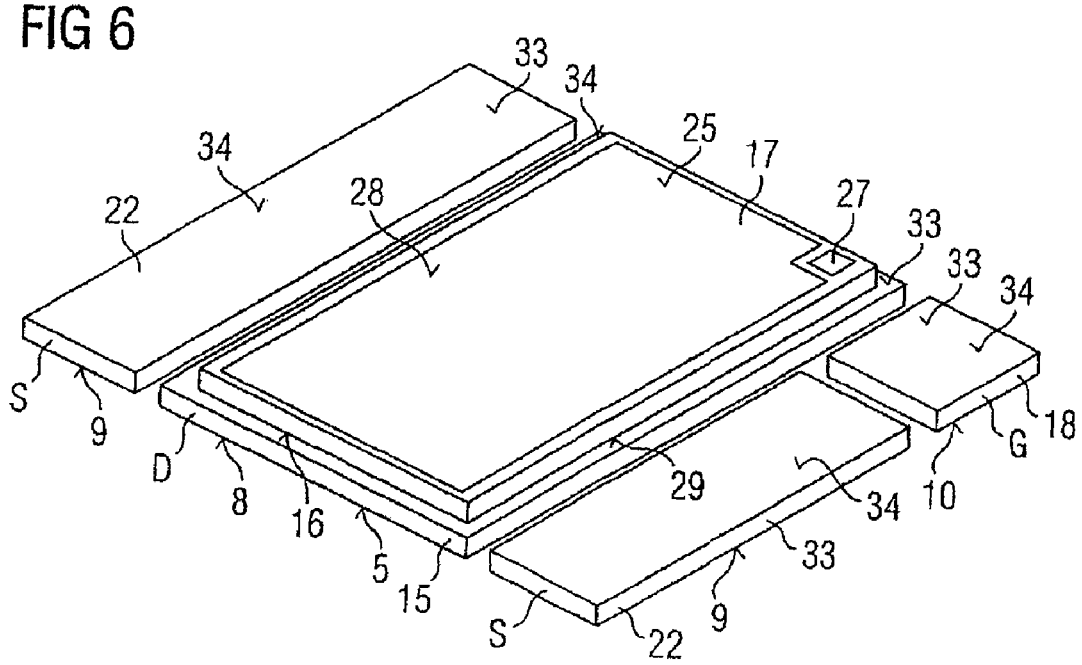

FIG. 6 shows a schematic, perspective view of the structure in accordance with FIG. 5, after the application of a MOSFET power semiconductor chip 17. The MOSFET power semiconductor chip 17 is mounted with its rear side 16, which comprises a drain contact area, onto the prepared lead chip island 15 of the mounting leadframe. During this mounting, an areal connecting layer is fitted between the rear side chip contact 16 of the power semiconductor chip 17 and the lead chip island 15, which layer may comprise a conductive adhesive, a soft solder, a diffusion solder or a solder paste. The top side 28 of the power semiconductor chip 17 comprises top side chip electrodes 25, wherein a large-area source electrode 26 in this embodiment of the power semiconductor chip 17 and a smaller gate electrode 27 are arranged on the top side 28. The rear side 29 of the power semiconductor chip 17 is substantially taken up by the drain electrode situated there.

Figure 7:
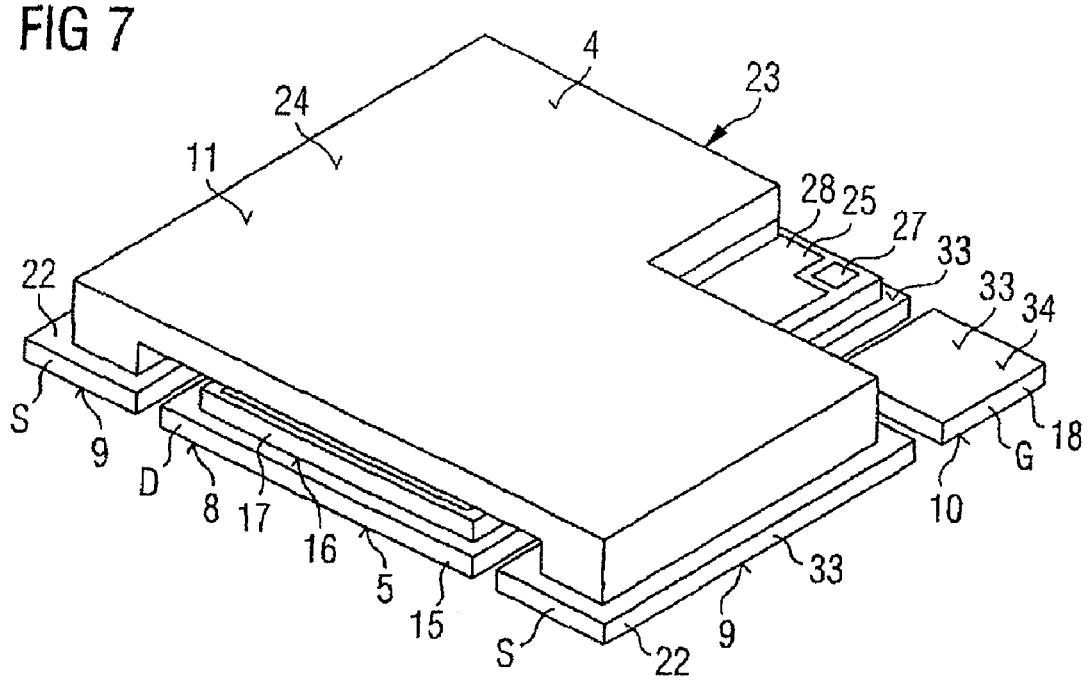

FIG. 7 shows a schematic, perspective view of the structure in accordance with FIG. 6, after the application of a source through contact element 23 to lead source electrodes 22 with the source external contact areas 9 on its underside and the source external contact area 11 on its top side 24. For this purpose, the source through contact element 23 is formed in U-shaped fashion, wherein the source through contact element 23 is cohesively connected in its central region to the source electrode 26 of the power semiconductor component chip 17.

Figure 8:
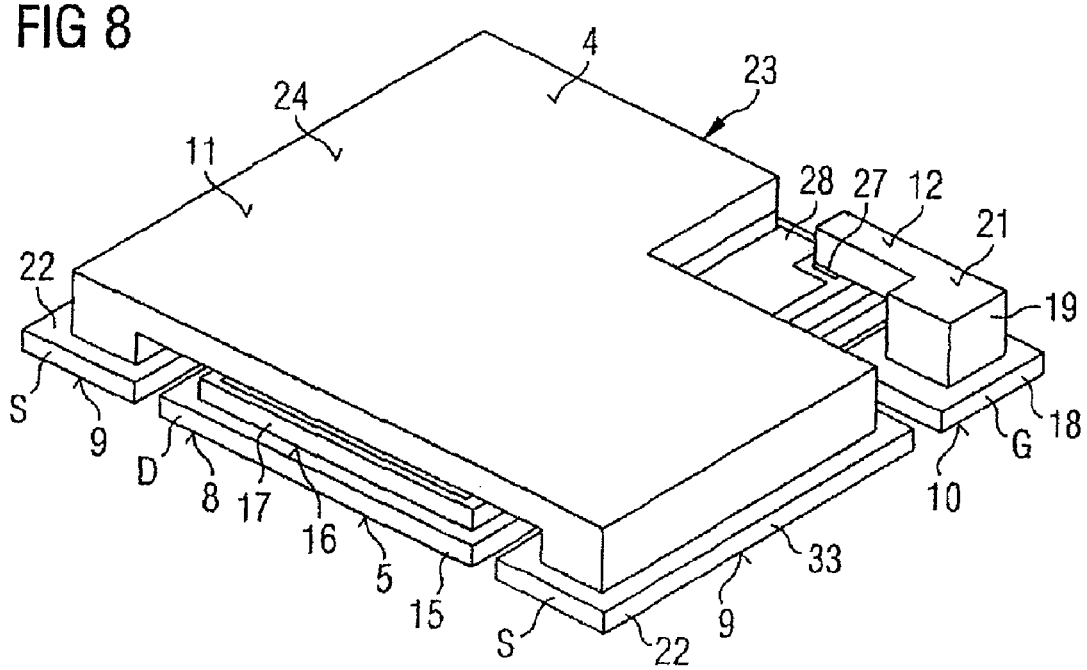

FIG. 8 shows a schematic, perspective view of the structure in accordance with FIG. 7, after the application of a gate through contact element 19 to a lead gate electrode 18 with the gate external contact area 10. This gate through contact element 19 is configured such that the upper gate external contact area 12 is arranged on its top side 21 and the gate external contact area can be accessed from the top side of the power semiconductor component 2. In addition, the through contact element 19 is cohesively connected to the gate electrode 27 of the power semiconductor chip 17.

Figure 9:
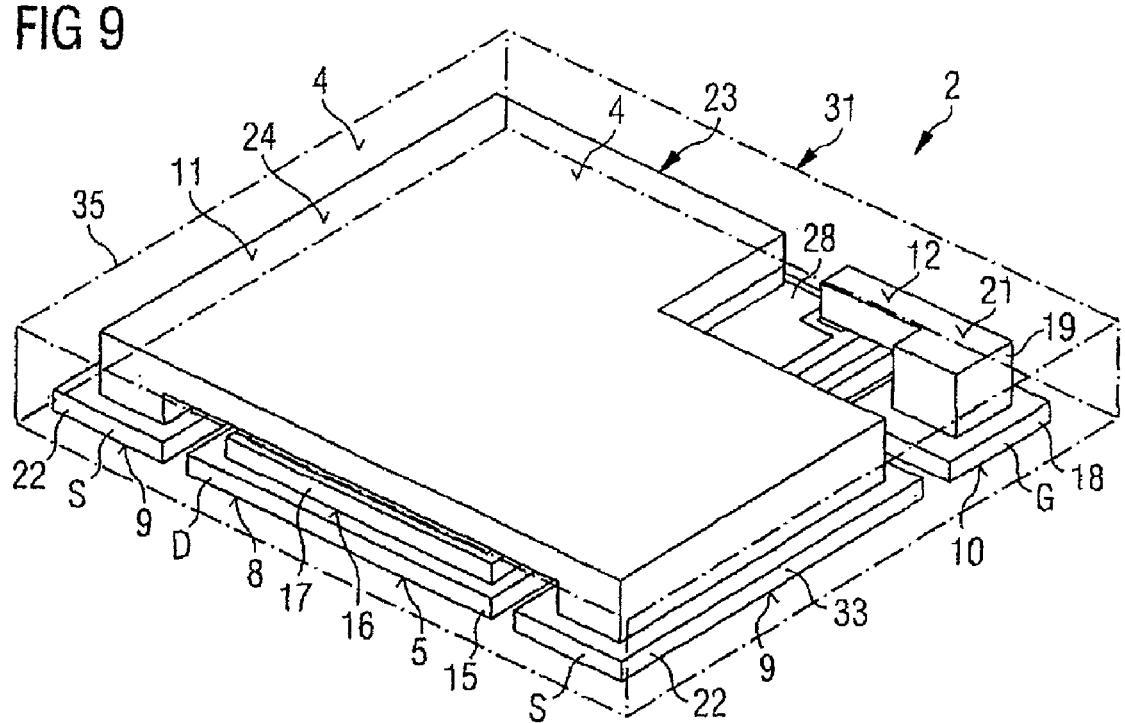

FIG. 9 shows a schematic, perspective view after embedding the structure in accordance with FIG. 8 into a plastic housing composition 31. In this case, the contour of the plastic housing composition 31 is marked by a dash-dotted line 35 and represented as transparent plastic housing composition 31 in FIG. 9. However, a non-transparent plastic housing composition 31 filled with ceramic particles is usually used for such power semiconductor components 2.

FIG. 10 shows a schematic, perspective view of the top side 4 of the MOSFET power semiconductor component 2, with the source external contact area 11—embedded into the plastic housing composition 31—of the top side 4 and with the gate external contact area 12 of the top side 4.

FIG. 11 shows a schematic, perspective view of the underside 5 of the MOSFET power semiconductor component 2 for a power semiconductor component stack, wherein the underside 5 comprises two source external contact areas 9, a drain external contact area 8 and a gate external contact area 10. These external contact areas are arranged such that power semiconductor components 2 of this type can be stacked to form a series power semiconductor component stack, but the source external contact areas 9 on the underside 5 are to be covered by an insulation film during stacking and the areal extent of the gate external contact area 12 on the top side 4 is likewise partly to be reduced for stacking via an insulation film covering part of the gate external contact area 12. It is thus possible to realize an intermediate plane in a power semiconductor component stack with two of these power semiconductor components 2, but a conduction strip from the top side of the power semiconductor component stack to the level of the underside of the power semiconductor component stack is necessary since only two electrodes of the three electrodes of a power semiconductor component 2 are looped through via through contacts through the stack.

FIGS. 12 to 16 show schematic, perspective views of component parts of a MOSFET power semiconductor component 20 of a second embodiment for a power semiconductor component stack 1 or 30, in accordance with FIG. 2 or FIG. 4. Component parts having the same functions as in the previous figures are identified by the same reference symbols and are not discussed separately in FIGS. 12 to 16.

FIG. 12 shows a schematic, perspective view of a structure of external contacts 33 of the MOSFET power semiconductor component of a lead mounting strip. In this second embodiment of a MOSFET power semiconductor component, the external contact areas 33 for the source external contact areas 9 and for the gate external contact area 10 are angled, and reach as far as the outer edges of the power semiconductor component provided.

FIG. 13 shows a schematic, perspective view of a structure in accordance with FIG. 12, after the application of a power semiconductor chip 17. The power semiconductor chip 17 is applied to the chip island 15 by its rear side, which comprises a drain electrode. Consequently, via the external contact 33 with the drain external contact area 8, the rear side 29 of the power semiconductor component becomes accessible from the underside 5 of the power semiconductor component to be formed.

FIG. 14 shows a schematic, perspective view of the structure in accordance with FIG. 13 with an applied source through contact element 23, which includes the source external contact area 11 on its top side 4 and is cohesively connected by its undersides on the external contacts 33 to the source external contact areas 9. Furthermore, FIG. 14 already shows the applied gate through contact element 19, which includes the gate external contact area 12 on its top side 21 and is arranged with its underside on the lead gate electrode 18.

Figure 15:
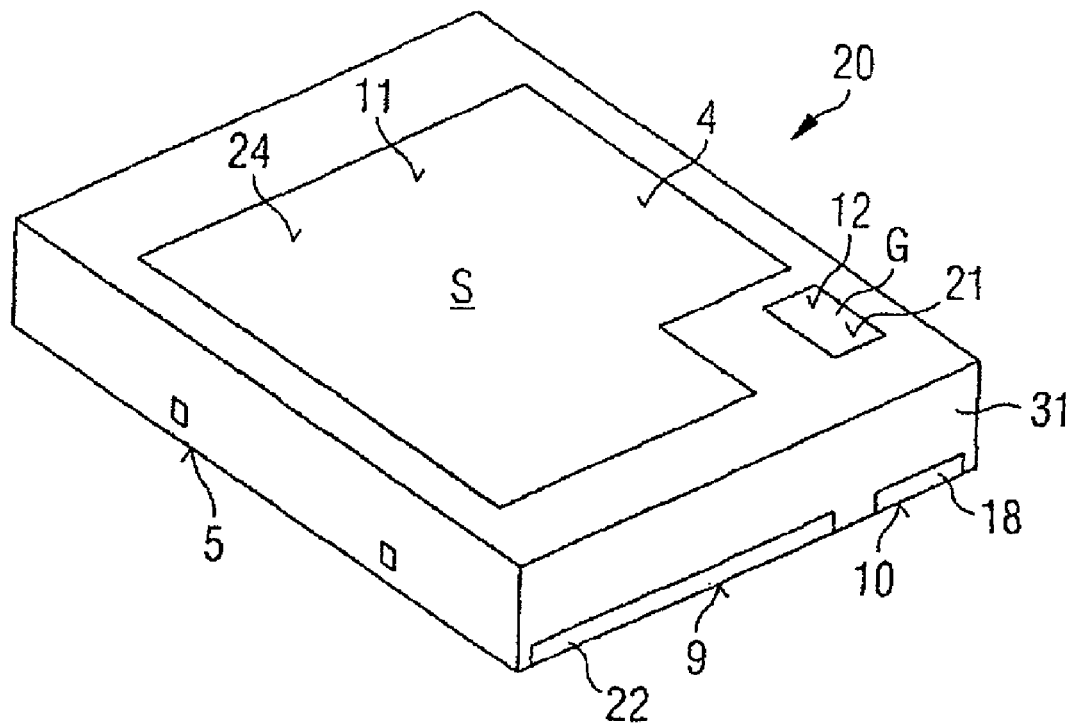

FIG. 15 shows a schematic, perspective view of the top side 4 of the completed MOSFET power semiconductor component 20 for a power semiconductor component stack. In this case, the source external contact area 11 and the gate external contact area 12 are arranged on the top side 4, as known from the power semiconductor component 2 of the first embodiment. The underside 5 of the power semiconductor component 20 of this second embodiment differs by comparison therewith, however.

Figure 16:
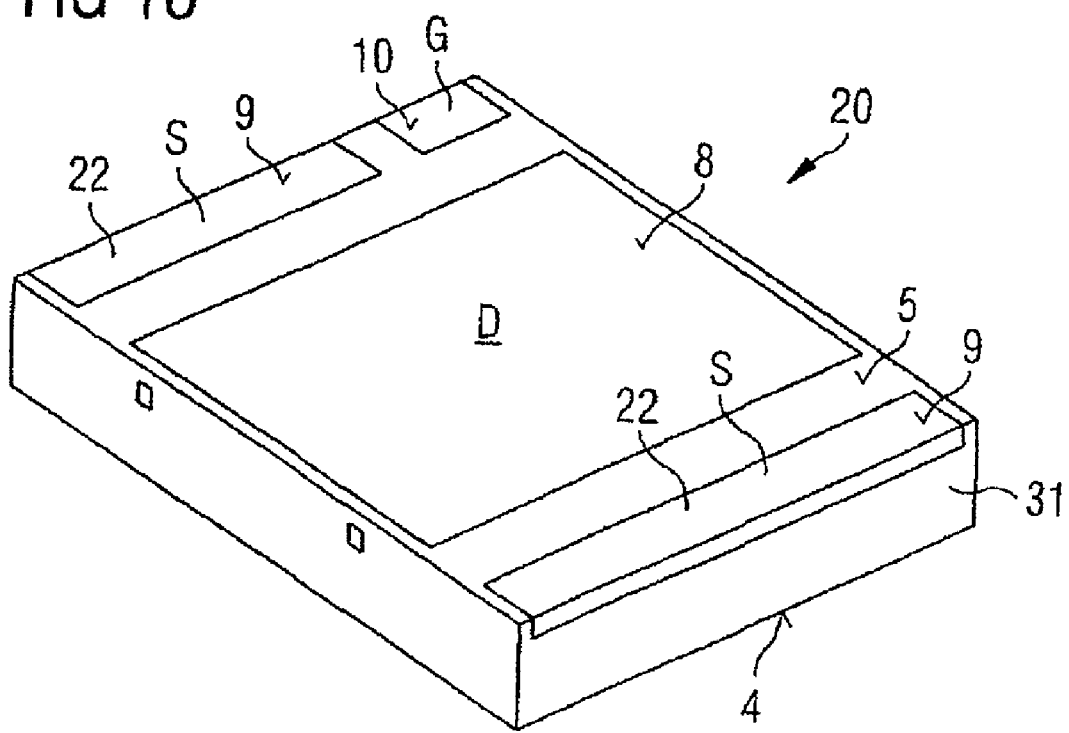

FIG. 16 shows a schematic, perspective view of the underside 5 of the completed MOSFET power semiconductor component 20 for a power semiconductor component stack as shown by FIGS. 2 and 4. The difference with respect to the first embodiment is that now the lead source electrodes 22 are also accessible at the edge sides of the MOSFET power semiconductor component 2. The same applies to the gate external contact area 10, which likewise extends partly over the edge of the power semiconductor component 20. By contrast, the central drain external contact area 8 remains unchanged.

What is claimed is:

1. A power semiconductor component stack using lead technology with surface-mountable external contacts, the power semiconductor component stack comprising:
    at least upper and lower MOSFET power semiconductor components arranged one above another in series or in parallel, with an intermediate plane between the upper and lower MOSFET power semiconductor components,
    the upper MOSFET power semiconductor component including: a top side comprising at least one source external contact area and a gate external contact area; and an underside comprising a drain external contact area, a source external contact area and a gate external contact area, the gate external contact area on the underside being electrically connected to the gate external contact area on the top side; and
    the lower MOSFET power semiconductor component including: a top side comprising at least one source external contact area and a gate external contact area; and an underside comprising a drain external contact area, a source external contact area and a gate external contact area, the gate external contact area on the underside of the lower MOSFET power semiconductor component being electrically connected to the gate external contact area on the top side of the lower MOSFET power semiconductor component,
    wherein the gate external contact area on the underside of the upper MOSFET power semiconductor component is electrically connected in the intermediate plane to the gate external contact area on the top side of the lower MOSFET power semiconductor component.

2. The power semiconductor component stack of claim 1, wherein the at least upper and lower MOSFET power semiconductor components are arranged one above another in series, and
    the source external contact area on the top side of the lower MOSFET power semiconductor component is surface-mounted with the drain external contact area of the upper MOSFET power semiconductor component in the intermediate plane, and the source external contact area on the underside of the upper MOSFET power semiconductor component is protected by an insulation film.

3. The power semiconductor component stack of claim 1, wherein the at least upper and lower MOSFET power semiconductor components are arranged one above another in parallel, and
    the source external contact area on the underside of the upper MOSFET power semiconductor component is electrically connected to the source external contact area on the top side of the lower MOSFET power semiconductor component in the intermediate plane, and the gate external contact area on the underside of the upper MOSFET power semiconductor component is electrically connected to the gate external contact area on the top side of the lower MOSFET power semiconductor component in the intermediate plane.

4. The power semiconductor component stack of claim 1, wherein each of the upper and lower power semiconductor components further comprises:
    a lead chip island comprising the drain external contact area; and
    a power semiconductor chip with a rear side chip contact arranged on and cohesively connected to the lead chip island.

5. The power semiconductor component stack of claim 4, wherein each of the upper and lower MOSFET power semiconductor components further comprises:
    a lead gate electrode comprising the gate external contact area on the underside; and
    a gate through contact element arranged on and cohesively connected to the lead gate electrode, a top side of the gate through contact element comprising the gate external contact area on the top side.

6. The power semiconductor component stack of claim 5, wherein each of the upper and lower MOSFET power semiconductor components further comprises:
    a lead source electrode comprising the source external contact area on the underside; and
    a source through contact element arranged on and cohesively connected to the lead source electrode, a top side of the source through contact element comprising the source external contact area on the top side.

7. The power semiconductor component stack of claim 6, wherein at least one of the cohesive connections is a conductive adhesive connection.

8. The power semiconductor component stack of claim 6, wherein at least one of the cohesive connections is a eutectic soldering connection.

9. The power semiconductor component stack of claim 6, wherein at least one of the cohesive connections is a diffusion soldering connection.

10. The power semiconductor component stack of claim 6, wherein at least one of the cohesive connections is a conductive adhesive film.

11. The power semiconductor component stack of claim 6, wherein at least one of the cohesive connections is a solder paste connection.

12. The power semiconductor component stack of claim 4, wherein the power semiconductor chip is arranged such that the rear side chip contact is freely accessible via the lead chip island.

13. The power semiconductor component stack of claim 4, wherein the rear side chip contact comprises a metal block as a heat sink, the metal block having an areal extent adapted to the rear side chip contact.

14. The power semiconductor component stack of claim 4, wherein the power semiconductor chip of the upper MOSFET power semiconductor component further comprises a top side chip electrode that is cohesively connected to the source external contact area on the underside of the upper MOSFET power semiconductor component, and wherein the power semiconductor chip of the lower MOSFET power semiconductor component further comprises a top side chip electrode that is cohesively connected to the source external contact area on the underside of the lower MOSFET power semiconductor component.

* * * * *